(12) United States Patent
Yuu et al.

(10) Patent No.: US 9,969,160 B2
(45) Date of Patent: May 15, 2018

(54) PIEZOELECTRIC SUBSTRATE, ASSEMBLY, LIQUID DISCHARGE HEAD, AND RECORDING DEVICE, EACH USING PIEZOELECTRIC SUBSTRATE

(71) Applicant: KYOCERA Corporation, Kyoto-shi, Kyoto (JP)

(72) Inventors: Yoshihiro Yuu, Kirishima (JP); Kouji Eitoku, Kirishima (JP); Kosei Horiuchi, AIra (JP)

(73) Assignee: KYOCERA CORPORATION, Tokyo (JP)

( * ) Notice: Subject to any disclaimer, the term of this patent is extended or adjusted under 35 U.S.C. 154(b) by 0 days. days.

(21) Appl. No.: 15/107,767

(22) PCT Filed: Dec. 25, 2014

(86) PCT No.: PCT/JP2014/084320
§ 371 (c)(1),
(2) Date: Jun. 23, 2016

(87) PCT Pub. No.: WO2015/099046
PCT Pub. Date: Jul. 2, 2015

(65) Prior Publication Data
US 2016/0332446 A1    Nov. 17, 2016

(30) Foreign Application Priority Data
Dec. 25, 2013 (JP) .................. 2013-267390

(51) Int. Cl.
*B41J 2/14* (2006.01)
*H01L 41/047* (2006.01)
*H01L 41/187* (2006.01)

(52) U.S. Cl.
CPC ....... *B41J 2/14233* (2013.01); *B41J 2/14209* (2013.01); *H01L 41/0475* (2013.01);
(Continued)

(58) Field of Classification Search
CPC .... B41J 2002/14459; B41J 2002/14225; B41J 2002/14217; B41J 2002/14491; B41J 2/14072; B41J 2/14233; B41J 2/14209
See application file for complete search history.

(56) References Cited

U.S. PATENT DOCUMENTS

2005/0253488 A1    11/2005    Ito
2013/0335486 A1    12/2013    Kobayashi et al.

FOREIGN PATENT DOCUMENTS

JP    2006-123519 A    5/2006
JP    2010-125765 A    6/2010
(Continued)

OTHER PUBLICATIONS

International Search Report, PCT/JP2014/084320, Mar. 3, 2015, 1 pg.
(Continued)

*Primary Examiner* — Geoffrey Mruk
(74) *Attorney, Agent, or Firm* — Volpe and Koenig, P.C.

(57) ABSTRACT

The present invention aims at providing a piezoelectric substrate with high joining strength between an electrode of the piezoelectric substrate. The piezoelectric substrate of the present invention is a flat plate-shaped piezoelectric substrate including a piezoelectric ceramic layer, a plurality of first electrodes and a second electrode disposed on one main surface of the piezoelectric ceramic layer, a third electrode disposed on the other main surface of the piezoelectric ceramic layer so as to oppose to the first electrodes, and a through-conductor electrically connecting the second electrode and the third electrode. The second electrode includes a connection portion connected to the through-conductor, and a small-width portion having a smaller width than the connection portion when the piezoelectric substrate is viewed from above. The second electrode and the outside
(Continued)

are electrically connected to each other at the small-width portion.

17 Claims, 9 Drawing Sheets

(52) U.S. Cl.
CPC ........ *H01L 41/187* (2013.01); *H01L 41/1876* (2013.01); *H01L 41/1878* (2013.01); *B41J 2002/14217* (2013.01); *B41J 2002/14225* (2013.01); *B41J 2002/14306* (2013.01); *B41J 2002/14459* (2013.01); *B41J 2002/14491* (2013.01)

(56) References Cited

FOREIGN PATENT DOCUMENTS

| | | | | |
|---|---|---|---|---|
| JP | 2012-201009 | * | 10/2012 | .............. B41J 2/045 |
| JP | 2012-201009 A | | 10/2012 | |

OTHER PUBLICATIONS

Extended European Search Report, European Patent Application No. 14874339.6, Jul. 25, 2017, 8 pgs.

* cited by examiner

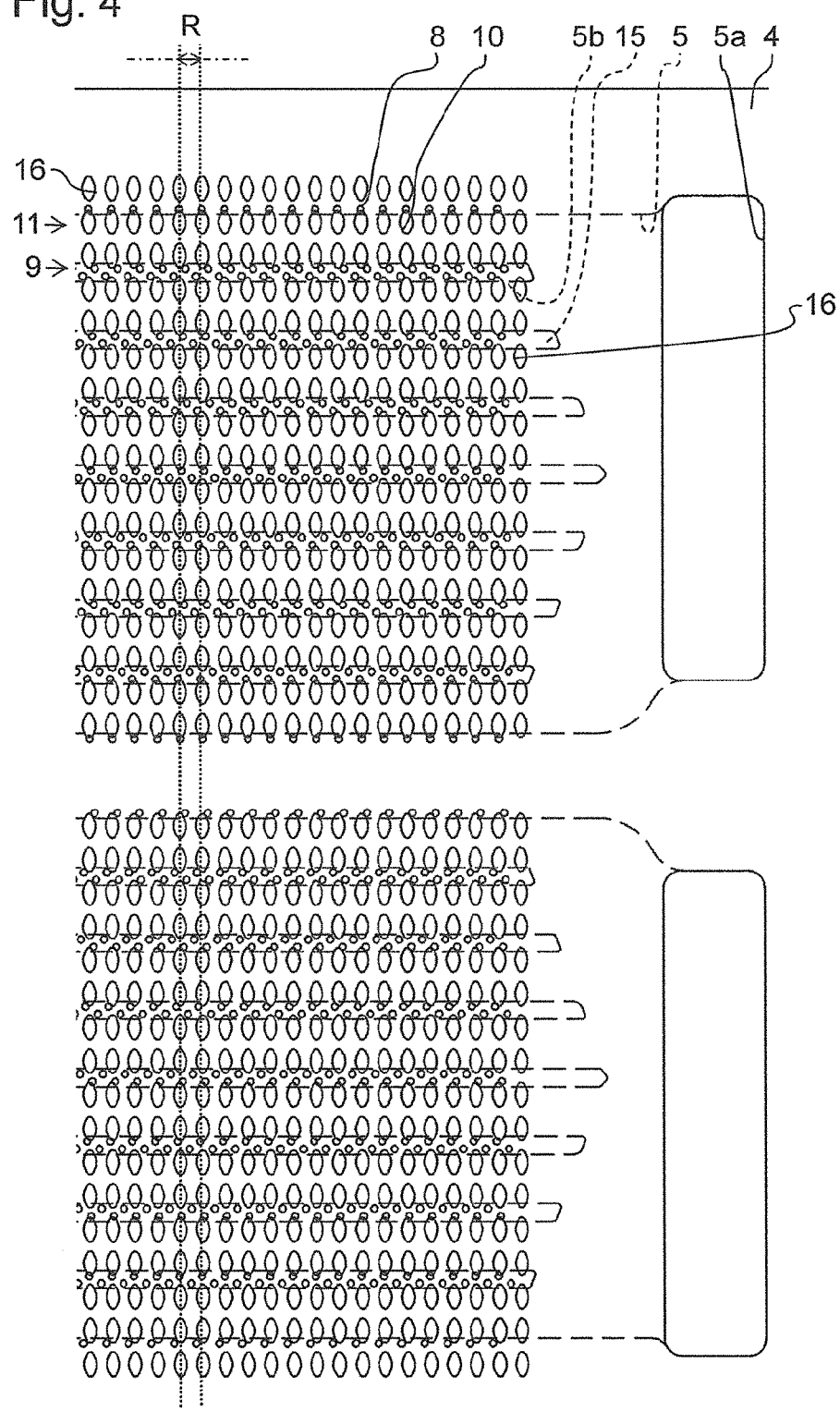

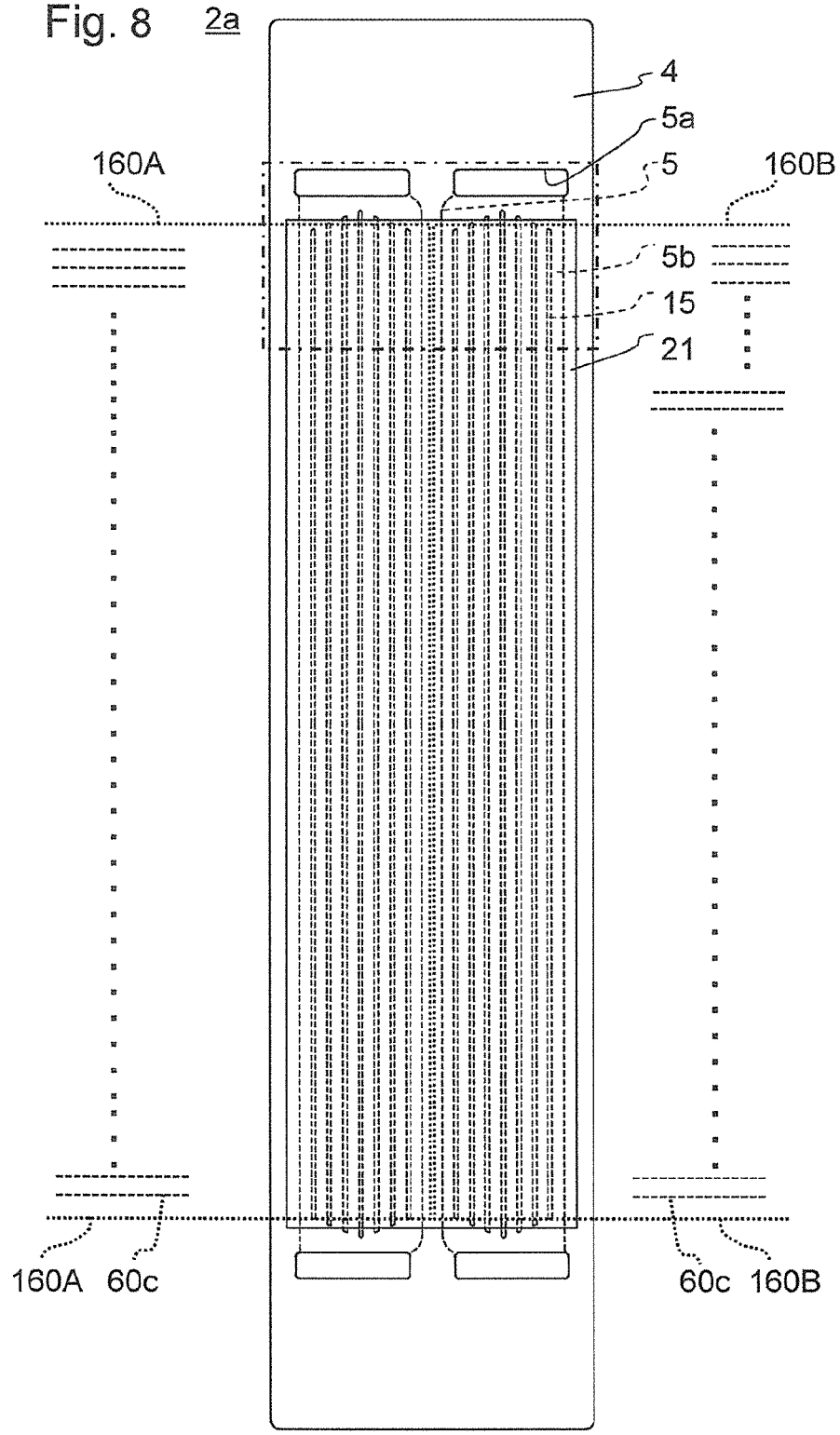

PIEZOELECTRIC SUBSTRATE, ASSEMBLY, LIQUID DISCHARGE HEAD, AND RECORDING DEVICE, EACH USING PIEZOELECTRIC SUBSTRATE

TECHNICAL FIELD

The present invention relates to a piezoelectric substrate, as well as an assembly, a liquid discharge head, and a recording device, each of which uses the piezoelectric substrate.

BACKGROUND ART

As a liquid discharge head, for example, an inkjet head has conventionally been known which carries out various kinds of printings by discharging a liquid onto a recording medium. The liquid discharge head includes a flow channel member having a plurality of discharge holes and a plurality of pressurizing chambers, and a piezoelectric actuator substrate having a displacement element to pressurize a liquid in the pressurizing chambers. The displacement element is made up of a common electrode, an individual electrode, and a piezoelectric body held therebetween. The common electrode is electrically connected, via a through-conductor penetrating through the piezoelectric body, to a surface electrode for the common electrode disposed on the same surface as the individual electrode. An FPC (flexible printed circuit) is electrically connected to the individual electrode and the surface electrode for the common electrode on the piezoelectric substrate in order to drive the displacement element (for example, refer to Patent Document 1).

PRIOR ART DOCUMENT

Patent Document

Patent Document 1: Japanese Patent Unexamined Publication No. 2006-123519

SUMMARY OF THE INVENTION

Problems to be Solved by the Invention

The piezoelectric substrate, such as the piezoelectric actuator substrate for use in the liquid discharge head as described in Patent Document 1 has the following problem. That is, when an attempt is made to electrically connect the individual electrode (first electrode) and the surface electrode (second electrode) for the common electrode to the outside in order to drive the displacement element, connection conditions may change by a difference in planar shape and a difference in cross-sectional shape between the individual electrode and the surface electrode for the common electrode. Consequently, one joining strength becomes lower than another one, and a weak connection comes off.

Particularly, in a piezoelectric substrate using a piezoelectric ceramic, a via hole configured to accommodate the through conductor therein is often formed before firing because it is easier to form the via hole before the firing. On that occasion, misalignment of the via hole occurs due to dimensional variation in a planar direction caused by firing contraction. To cope with this, the surface electrode for the common electrode is made into a planar shape that is large enough for electrical connection even when being subjected to the misalignment. Due to the influence thereof, the joining strength between the surface electrode for the common electrode and the outside may become low.

Accordingly, the present invention aims at providing a piezoelectric substrate with high joining strength between an electrode, particularly an electrode (second electrode) for a common electrode on the piezoelectric substrate and the outside, as well as an assembly, a liquid discharge head, and a recording device, each of which uses the piezoelectric substrate.

Means for Solving the Problems

The piezoelectric substrate of the present invention is a flat plate-shaped piezoelectric substrate including a piezoelectric ceramic layer, a plurality of first electrodes and one or more second electrodes disposed on one main surface of the piezoelectric ceramic layer, a third electrode disposed on the other main surface of the piezoelectric ceramic layer so as to oppose to the first electrodes, and a through-conductor penetrating through the piezoelectric ceramic layer and electrically connecting the second electrode and the third electrode. The second electrode includes a connection portion connected to the through-conductor and a small-width portion having a smaller width than the connection portion when the piezoelectric substrate is viewed from above.

The assembly of the present invention includes the piezoelectric substrate, and first and second wiring boards that are disposed facing the piezoelectric substrate and includes a plurality of wiring lines electrically connected to the first electrodes and the second electrode. The piezoelectric substrate is long in one direction. The small-width portion constitutes a plurality of first and second small-width portion rows arranged side by side along the one direction in a middle part of the piezoelectric substrate in a direction orthogonal to the one direction. The first small-width portion row and the second small-width portion row are arranged in a direction orthogonal to the one direction. The small-width portion belonging to the first small-width portion row and the wiring line of the first wiring board are electrically connected to each other at a position along one side of an outer periphery of the first wiring board. The small-width portion belonging to the second small-width portion row and the wiring line of the second wiring board are electrically connected to each other at a position along one side of the outer periphery of the first wiring board.

The assembly of the present invention includes the piezoelectric substrate, and a wiring board that is disposed facing the piezoelectric substrate and includes a plurality of wiring lines electrically connected to the first electrodes and the second electrode. A planar shape of the wiring board is long in one direction and has a pair of sides along the one direction. The small-width portion extends along each of the pair of sides, and the second electrode and the wiring line are electrically connected to each other at the small-width portion extending along the pair of sides.

The liquid discharge head of the present invention includes a flow channel member including a plurality of discharge holes and a plurality of pressurizing chambers respectively connected to the discharge holes, and the piezoelectric substrate. The flow channel member and the piezoelectric substrate are joined to each other. The piezoelectric ceramic layer deforms and pressurizes a liquid in the pressurizing chambers by applying a voltage to between the first electrodes and the second electrode.

The liquid discharge head of the present invention includes a flow channel member including a plurality of discharge holes and a plurality of pressurizing chambers respectively connected to the discharge holes, and the assembly. The flow channel member and the piezoelectric substrate are joined to each other. The piezoelectric ceramic layer deforms and pressurizes a liquid in the pressurizing chambers by applying a voltage to between the first electrodes and the second electrode.

The recording device of the present invention includes the liquid discharge head, a transport section to transport a recording medium to the liquid discharge head, and a control section to control the liquid discharge head.

Effect of the Present Invention

With the piezoelectric substrate of the present invention, the bonding strength is enhanced because the electrical connection to the outside is made at the small-width portion in the second electrode. Additionally, a disconnection between the second electrode and the third electrode due to the misalignment during manufacturing, or the like is less liable to occur because the electrical connection between the second electrode and the third electrode is made at a connection portion having a larger width than the small-width portion on the second electrode.

BRIEF DESCRIPTION OF THE DRAWINGS

FIG. 4 is an enlarged view of the region surrounded by the chain line in FIG. 2, from which some of the flow channels are omitted for the sake of description;

FIG. 8 is a plan view of an assembly according to other embodiment of the present invention.

EMBODIMENTS FOR CARRYING OUT THE INVENTION

Figure 1A:
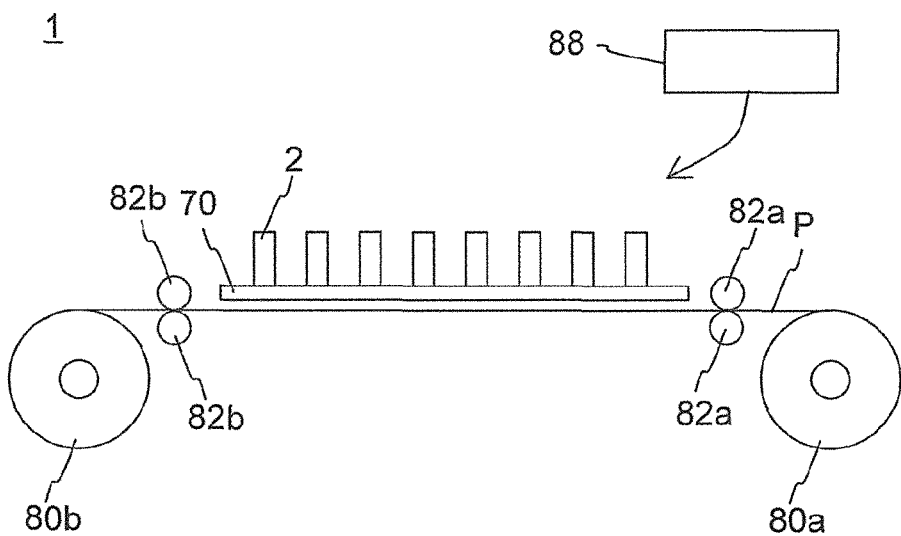
FIG. 1(a) is a side view of a recording device including a liquid discharge head according to an embodiment of the present invention.
Figure 1B:
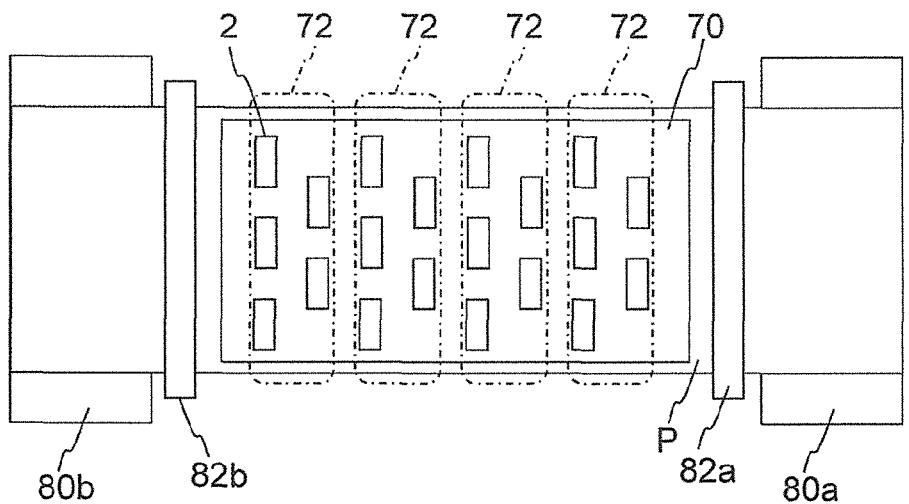
FIG. 1(b) is a plan view thereof.

FIG. 1(a) is a schematic side view of a color inkjet printer 1 (hereinafter also referred to simply as the printer) that is a recording device including a liquid discharge head 2 according to one embodiment of the present invention. FIG. 1(b) is a schematic plan view thereof. The printer 1 relatively moves a printing paper P that is a recording medium with respect to the liquid discharge head 2 by transporting the printing paper P from a transport roller 80a to a transport roller 80b. A control section 88 controls the liquid discharge head 2 on the basis of image data and character data so as to cause a liquid to be discharged toward the recording medium P and cause liquid drops to land on the printing paper P, thereby performing recording, such as printing, on the printing paper P.

In the present embodiment, the liquid discharge head 2 is fixed to the printer 1, and the printer 1 is a so-called line printer. Examples of other embodiments of the recording device of the present invention include a so-called serial printer that alternately performs an operation of moving, such as reciprocating, the liquid discharge head 2 in a direction intersecting with, for example, approximately orthogonal to a transport direction of the printing paper P, and a transport of the printing paper P.

A flat plate shaped head mounting frame 70 (hereinafter also referred to simply as the frame) is fixed to the printer 1 so as to be approximately parallel to the printing paper P. The frame 70 is provided with twenty holes (not shown), and twenty liquid discharge heads 2 are mounted on their respective corresponding hole portions. Liquid discharging portions of the liquid discharge heads 2 are configured to face the printing paper P. A distance between the liquid discharge heads and the printing paper P is set to, for example, approximately 0.5-20 mm. Five liquid discharge heads 2 constitute a head group 72, and the printer 1 has four head groups 72.

The liquid discharge heads 2 have an elongated shape that is long and narrow in a direction from a front side to a rear side in FIG. 1(a), or a vertical direction in FIG. 1(b). The elongated direction is also referred to as a longitudinal direction. Three liquid discharge heads 2 in the head group 72 are disposed along the direction intersecting with, for example, approximately orthogonal to the transport direction of the printing paper P, and the remaining two liquid discharge heads 2 are respectively disposed between the three liquid discharge heads 2 and located at positions deviated from each other along the transport direction. The liquid discharge heads 2 are disposed so that ranges respectively printable by the liquid discharge heads 2 are connected to each other in a width direction of the printing paper P (the direction intersecting the transport direction of the printing paper P), or overlapped with each other via their respective ends. This permits printing without leaving any blank space in the width direction of the printing paper P.

The four head groups 72 are disposed along the transport direction of the recording paper P. A liquid, such as ink, is supplied from a liquid tank (not shown) to each of the liquid discharge heads 2. Inks of the same color are supplied to the liquid discharge heads 2 belonging to the single head group 72, and inks of four colors are printable by the four head groups. The colors of inks to be discharged from the head groups 72 are, for example, magenta (M), yellow (Y), cyan (C), and black (K). A color image is printable by printing these inks under the control of the control section 88.

The number of the liquid discharge heads 2 mounted on the printer 1 may be one for printing over the range printable by the single liquid discharge head 2 with a single color. The number of the liquid discharge heads 2 included in the head group 72, and the number of the head groups 72 are suitably changeable according to a printing object and printing conditions. For example, the number of the head groups 72 may be increased in order to perform more multicolor printing. Even when used the liquid discharge heads 2 having the same performance, a transport velocity can be increased by disposing the head groups 72 that perform printing with the same color, and causing these head groups 72 to alternately perform printing in the transport direction. This ensures a large printing area per time. Alternatively, resolution in the width direction of the printing paper P may be enhanced by preparing the head groups 72 that perform printing with the same color, and disposing these head groups 72 with a deviation in the direction intersecting the transport direction.

Besides printing colored inks, a liquid, such as coating agent, may be printed in order to carry out surface treatment of the printing paper P.

The printer 1 performs printing on the printing paper P as a recording medium. The printing paper P is being wound up onto a paper feed roller 80a. After the printing paper P passes through between two guide rollers 82a, the printing paper P passes under the liquid discharge heads 2 mounted on the frame 70, and then passes through between two transport rollers 82b, and is finally recovered onto a recovery roller 80b. When performing printing, the printing paper P is transported at a constant velocity and subjected to printing by the liquid discharged heads 2 by rotating the transport rollers 82b. The recovery roller 80b winds up the printing paper P fed out of the transport rollers 82b. The transport velocity is set to, for example, 75 m/min. Each of these rollers may be controlled by the control section 88, or may be manually operated by an operator.

The recording medium may be a roll-shaped cloth besides the printing paper P. The printer 1 may be configured to directly transport a transport belt with the recording medium mounted on the transport belt, instead of directly transporting the printing paper P. With this configuration, it is possible to employ, as a recording medium, sheet papers, cut cloths, wood, tiles, or the like. Further, for example, wiring patterns of electronic devices may be printed by causing a liquid containing conductive particles to be discharged from the liquid discharge heads 2. Furthermore, chemicals may be manufactured by causing a predetermined amount of each of a liquid chemical agent and a liquid containing a chemical agent to be discharged from the liquid discharge heads 2 toward a reaction vessel or the like, followed by a reaction therebetween.

For example, a position sensor, a velocity sensor, and a temperature sensor may be attached to the printer 1, and the control section 88 may control components of the printer 1 according to states of the components of the printer 1, which are revealed from information from these sensors. For example, when a temperature of the liquid discharge heads 2, a temperature of the liquid in the liquid tank, and a pressure applied to the liquid discharge heads 2 by the liquid in the liquid tank affect discharge characteristics of the liquid to be discharged (such as a discharge rate and a discharge velocity), it may be configured to change a drive signal for discharging the liquid in the liquid discharge heads 2 according to their respective information.

Figure 2:
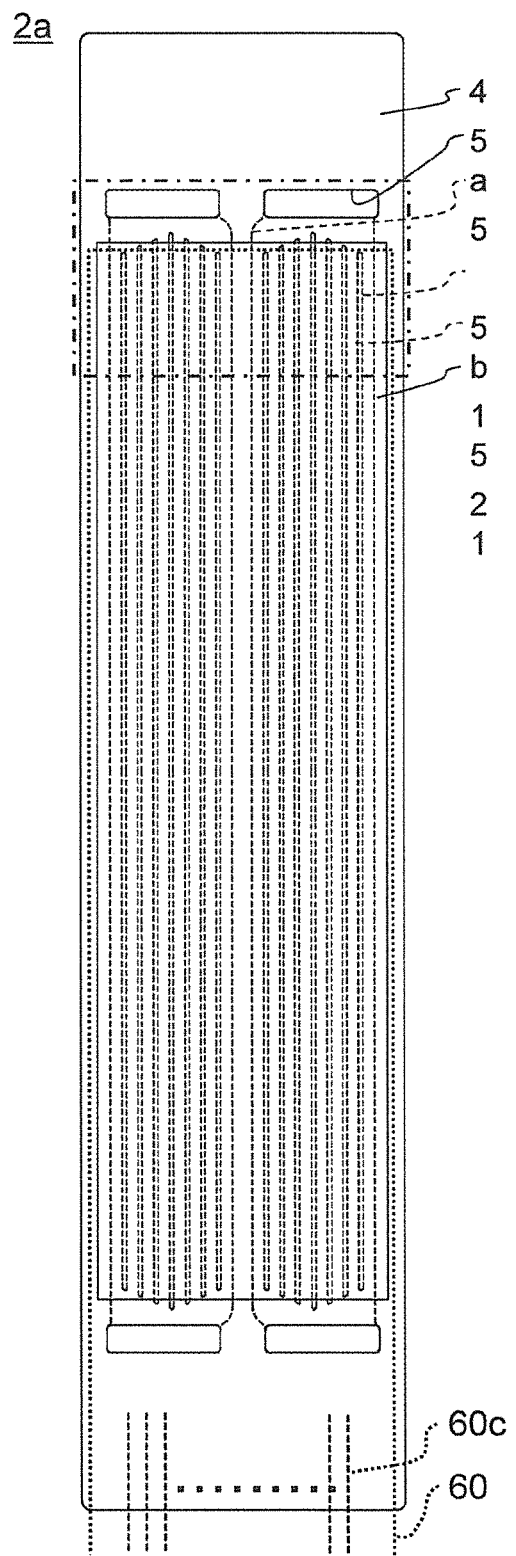
FIG. 2 is a plan view of a head body that is a main component of the liquid discharge head in FIG. 1.
Figure 3:
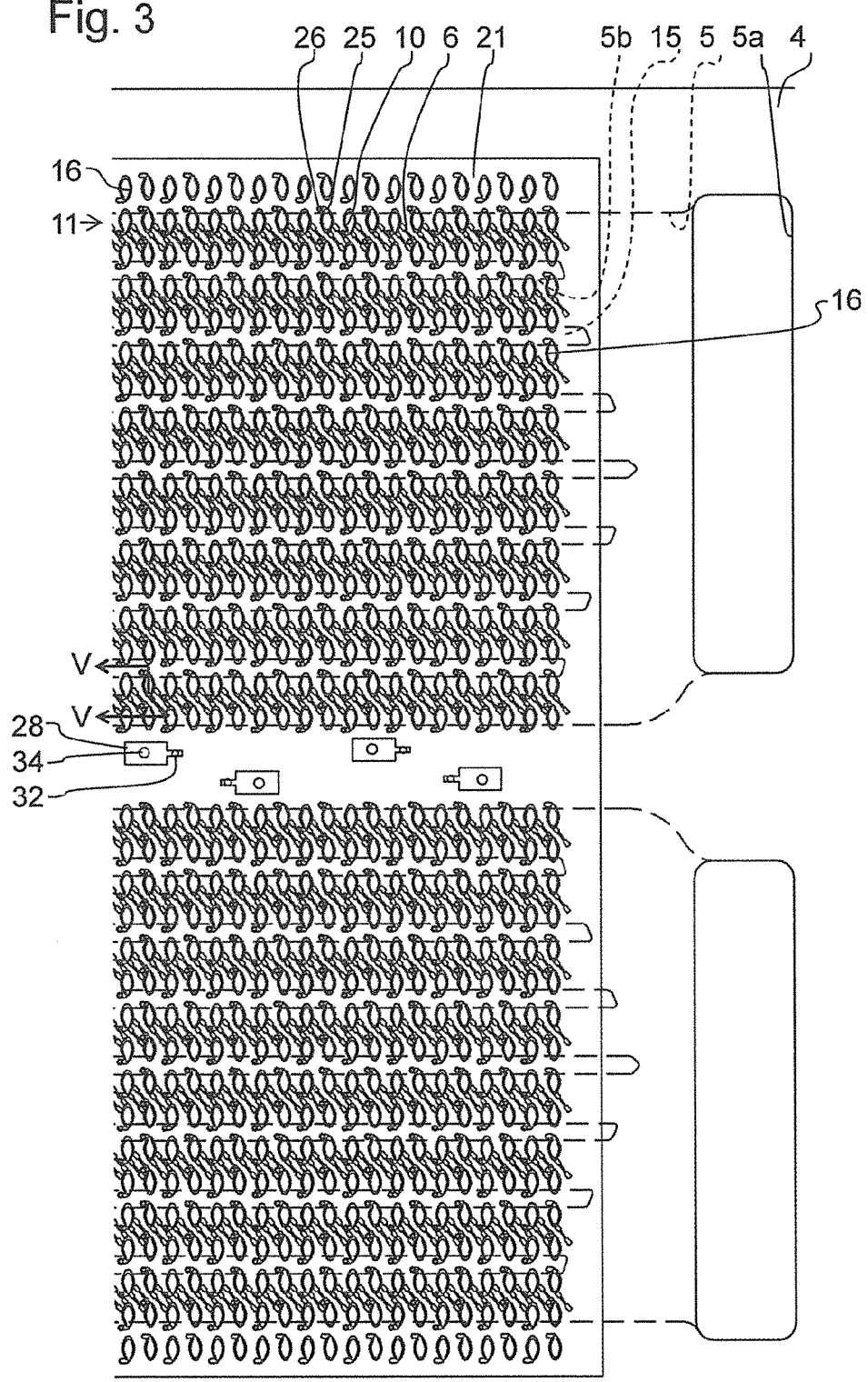
FIG. 3 is an enlarged view of a region surrounded by a chain line in FIG. 2, from which some of flow channels are omitted for the sake of description.
Figure 5A:
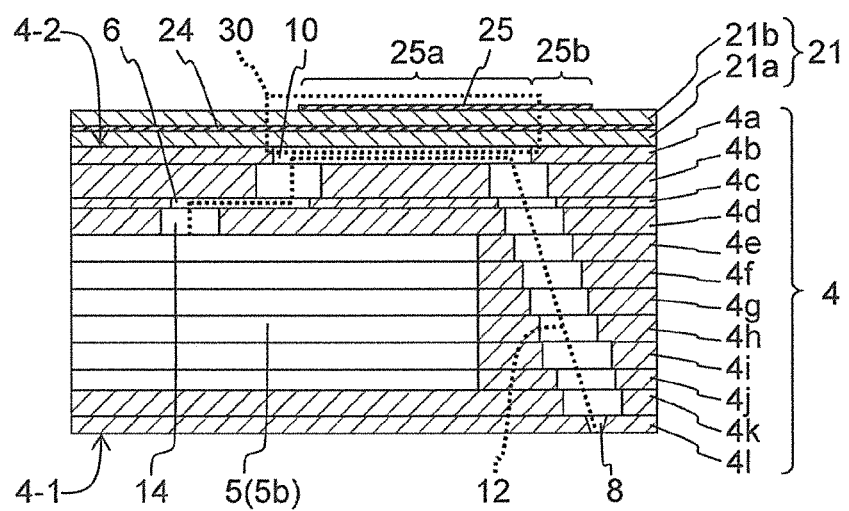
FIG. 5(a) is a longitudinal sectional view taken along line V-V in FIG. 3.
Figure 5B:
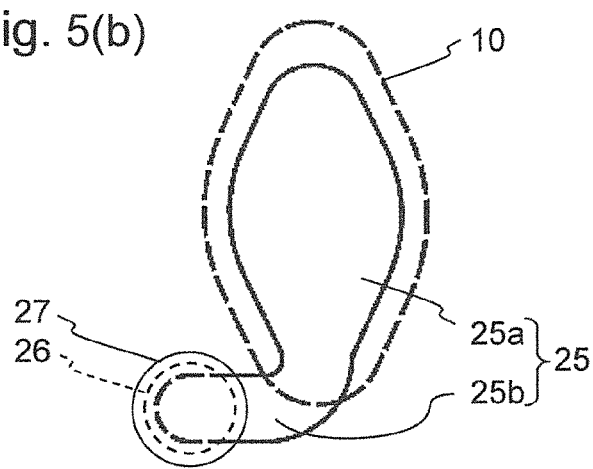
FIG. 5(b) is an enlarged plan view in the vicinity of a first electrode (individual electrode)
Figure 6A:
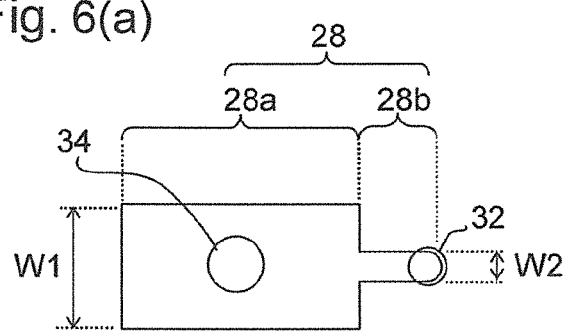
FIG. 6(a) is a plan view of a second electrode (surface electrode for a common electrode) of a piezoelectric actuator substrate shown in FIGS. 2 to 4, and FIGS. 6(b) and 6(c) are plan views of a second electrode in other embodiment of the present invention.

The liquid discharge head 2 according to the one embodiment of the present invention is described below. FIG. 2 is a plan view showing a head body 2a that is a main component of the liquid discharge head 2 shown in FIG. 1. FIG. 3 is an enlarged plan view of a region surrounded by a chain line in FIG. 2, showing a part of the head body 2a. Some of flow channels are omitted in FIG. 3 for the sake of description. FIG. 4 is an enlarged plan view at the same position as in FIG. 3, in which some of the flow channels that differ from those in FIG. 3 are omitted. FIG. 5(a) is a longitudinal sectional view taken along line V-V in FIG. 3. FIG. 5(b) is an enlarged plan view in the vicinity of an individual electrode 25 as a first electrode in the head body 2a. FIG. 6(a) is a plan view of a surface electrode 28 for a common electrode which is a second electrode in a piezoelectric actuator substrate 21 used for the head body 2a. In FIGS. 3 to 6, for the purpose of further clarification of the drawings, pressurizing chambers 10, apertures 6, and discharge holes 8 which are located below the piezoelectric actuator substrate 21 and therefore should be drawn by a dashed line, and some of lands 26 and individual electrodes 25 which are located below individual electrode bump 27 and therefore should be drawn by a dashed line, are drawn by a solid line.

Each of the liquid discharge heads 2 may include, besides the head body 2a, a reservoir that supplies a liquid to the head body 2a, and a metal casing. The head body 2a includes a flow channel member 4 that is a support body, and the piezoelectric actuator substrate 21 that is a piezoelectric substrate in which displacement elements 30 are fabricated.

The flow channel member 4 constituting the head body 2a includes a manifold 5 that is a common flow channel, a plurality of pressurizing chambers 10 respectively connected to the manifold 5, and a plurality of discharge holes 8 respectively connected to the pressurizing chambers 10. The pressurizing chambers 10 open into an upper surface of the flow channel member 4, and the upper surface of the flow channel member 4 serves as a pressurizing chamber surface 4-2. The upper surface of the flow channel member 4 has an opening 5a being connected to the manifold 5. The liquid is to be supplied through the opening 5a.

The piezoelectric actuator substrate 21 including the displacement elements 30 is connected to the upper surface of the flow channel member 4 with an adhesive, and the displacement elements 30 are disposed so as to be located on the pressurizing chambers 10. A wiring board 60, such as an FPC (flexible printed circuit), for supplying signals to the displacement elements 30 is connected to the piezoelectric actuator substrate 21. The piezoelectric actuator substrate 21 and the wiring board 60 are collectively referred to as an assembly. In FIG. 2, to make clear a state in which a wiring board 60 is connected to the piezoelectric actuator substrate 21, an external form of a region of the wiring board 60 which is connected to the piezoelectric actuator substrate 21 is indicated by a dotted line. Electrodes of a wiring line 60c formed on the wiring board 60 are disposed in a rectangular form at an end portion of the wiring board 60, wherein the electrodes are electrically connected to the piezoelectric actuator substrate 21. The wiring board 60 is disposed to face the piezoelectric actuator substrate 21 and disposed along the longitudinal direction of the piezoelectric actuator substrate 21. The wiring board 60 further extends downward in FIG. 2 and is electrically connected to the control section 88 (through other circuit board as required). A large number of the wiring lines 60c included in the wiring board 60 are arranged in a direction intersecting the longitudinal direction of the wiring board 60, and extend along the longitudinal direction. The wiring lines 60c in FIG. 2 are schematically shown to make clear an arrangement direction and an extending direction.

The head body 2a has the single piezoelectric actuator substrate 21 including the flat plate shaped flow channel member 4 and the displacement elements 30 adhered onto the flow channel member 4. A planar shape of the piezoelectric actuator substrate 21 is an oblong (rectangle), and the piezoelectric actuator substrate 21 is disposed on the upper surface of the flow channel member 4 so that the long sides of the rectangular shape extend along the longitudinal direction of the flow channel member 4.

Two manifolds 5 are formed inside the flow channel member 4. The manifolds 5 have an elongated shape that extends from one end in the longitudinal direction of the flow channel member 4 to the other end, and are respectively provided with openings 5a of the manifolds 5 that open at both ends thereof into the upper surface of the flow channel member 4.

The manifolds 5 are partitioned at a central portion in the longitudinal direction, which is a region connected to at least the pressurizing chamber 10, by partition walls 15 disposed with a distance therebetween in the transverse direction. The partition walls 15 have the same height as the manifolds 5 and completely partition the manifolds 5 into a plurality sub manifolds 5b, at a central portion in the longitudinal direction which is a region connected to the pressurizing chamber 10. With this configuration, the discharge holes 8 and the flow channels connected from the discharge holes 8 to the pressurizing chamber 10 can be disposed so as to be overlapped with the partition walls 15 in a plan view.

A portion of the manifold 5 which is divided into a plurality of pieces is also referred to as the sub manifold 5b. In the present embodiment, two manifolds 5 are disposed independently, and the openings 5a are respectively disposed at both end portions of each of the manifolds 5. The single manifold 5 is provided with seven partition walls 15, and is divided into eight sub manifolds 5b. A width of the sub manifold 5b is larger than a width of the partition wall 15, thereby allowing a large amount of liquid to pass through the sub manifolds 5b.

The flow channel member 4 is formed with the pressurizing chambers 10 extending two-dimensionally. The pressurizing chambers 10 are hollow regions having a planar form of an approximately rhombus shape whose corners are rounded, or an elliptical shape.

The pressurizing chambers 10 are connected to one another through the sub manifold 5b and an individual supply flow channel 14. There is one pressurizing chamber row 11 that is a row of the pressurizing chambers 10 connected to the sub manifold 5b so as to extend along the sub manifold 5b on each of both sides of the sub manifold 5b, namely, there are a total of two pressurizing chamber rows. Accordingly, 16 pressurizing chamber rows 11 are disposed with respect to the single manifold 5, and a total of 32 pressurizing chamber rows 11 are disposed over the entirety of the head body 2a. All of the pressurizing chambers 10 in these pressurizing chamber rows 11 are disposed at identical intervals in the longitudinal direction, for example, at intervals of 37.5 dpi.

A column of dummy pressurizing chambers 16 is disposed at an end of each of the pressurizing chamber rows 11. The dummy pressurizing chambers 16 of this dummy pressurizing chamber column are connected to the manifold 5 but not connected to the discharge hole 8. A dummy pressurizing chamber row in which the dummy pressurizing chambers 16 are arranged linearly is disposed outside the 32 pressurizing chamber rows 11. The dummy pressurizing chambers 16 of the dummy pressurizing chamber row are connected to neither the manifold 5 nor the discharge hole 8. Owing to these dummy pressurizing chambers 16, the structure (rigidity) of the circumference of the pressurizing chambers 10 disposed inwardly of and adjacent to the end becomes similar to the structure (rigidity) of other pressurizing chambers 10, thereby reducing differences in liquid discharge characteristics. A difference in circumferential structure has greater influence on the pressurizing chambers 10 that are located within a short distance and adjacent to one another in a length direction. The dummy pressurizing chambers are respectively disposed at both ends in the length direction. The influence in the width direction is relatively small. Therefore, the dummy pressurizing chamber is disposed only on the side close to the end of the head body 21a. This makes it possible to decrease the width of the head body 21a.

The pressurizing chambers 10 connected to the single manifold 5 are disposed in a lattice form that makes rows and columns along outer sides of the piezoelectric actuator substrate 21 having a rectangular shape. Consequently, individual electrodes 25 that are first electrodes formed from the outer sides of the piezoelectric actuator substrate 21 onto the pressurizing chambers 10 are disposed at equal intervals. Therefore, the piezoelectric actuator substrate 21 is less subjected to a deformation when forming the individual electrodes 25. When the piezoelectric actuator substrate 21 and the flow channel member 4 are joined to each other, a large deformation may lead to a risk that stress is applied to the displacement elements 30 close to the outer sides and variations occur in displacement characteristics. However, the variations can be reduced by minimizing the deformation. It is further insusceptible to the influence of the deformation owing to the dummy pressurizing chamber row of the dummy pressurizing chambers 16 disposed outside the pressurizing chamber rows 11 closest to the outer sides. The pressurizing chambers 10 belonging to the pressurizing chamber row 11 are disposed at equal intervals, and the individual electrodes 25 corresponding to the pressurizing chamber row 11 are also disposed at equal intervals. The pressurizing chamber rows 11 are disposed at equal intervals in the traverse direction, and rows of the individual electrodes 25 corresponding to the pressurizing chamber rows 11 are also disposed at equal intervals in the traverse direction. This eliminates portions particularly subjected to influence of crosstalk.

Although the pressurizing chambers 10 are disposed in the lattice form in the present embodiment, the pressurizing chambers 10 in the pressurizing chamber rows 11 adjacent to each other may be disposed in a zigzag form so as to locate alternately with each other. This contributes to further increasing a distance between the pressurizing chambers 10 belonging to the adjacent pressurizing chamber row 11, thereby further reducing crosstalk.

Regardless of how the pressurizing chamber rows 11 are disposed, the crosstalk is reducible by disposing so that the pressurizing chambers 10 belonging to the single pressurizing chamber row 11 are not overlapped with the pressurizing chambers 10 belonging to the adjacent pressurizing chamber row 11 in the longitudinal direction of the liquid discharge head 2 when the flow channel member 4 is viewed from above. Meanwhile a large distance between the pressurizing chamber rows 11 increases the width of the liquid discharge head 2. Therefore, accuracy of a mounting angle of the liquid discharge heads 2 with respect to the printer 1, and accuracy of a relative position of the liquid discharge heads 2 when using the liquid discharge heads 2 exert a large influence on a printing result. Therefore, by making a width of the partition walls 15 smaller than the sub manifold 5b, the influence on the printing result exerted by their respective accuracies is reducible.

The pressurizing chambers 10 connected to the single sub manifold 5b constitute two columns of the pressurizing chamber rows 11, and the discharge holes 8 connected from the pressurizing chambers 10 belonging to the single pressurizing chamber row 11 constitute a discharge hole row 9. The discharge holes 8 connected to the pressurizing chambers 10 belonging to the two pressurizing chamber rows 11 respectively open into different sides of the sub manifold 5b. In FIG. 4, the two discharge hole rows 9 are disposed on the partition walls 15, and the discharge holes 8 belonging to each of the discharge hole rows 9 are connected via the pressurizing chamber 10 to the sub manifold 5b close to the discharge holes 8. When disposed so as to avoid overlapping with the discharge holes 8 connected to the adjacent sub manifold 5b via the pressurizing chamber row 11 in the longitudinal direction of the liquid discharge head 2, it is possible to reduce crosstalk between the flow channels that connect the pressurizing chambers 10 and the discharge holes 8, thereby further minimizing crosstalk. When disposed so as to avoid overlapping of the entirety of the flow channels connecting the pressurizing chambers 10 and the discharge holes 8 in the longitudinal direction of the liquid discharge head 2, crosstalk is further reducible.

A pressurizing chamber group (in the same range as a displacement element group 31) is made up of the pressurizing chambers 10 connected to the single manifold 5. There are the two manifolds 5, and accordingly there are two pressurizing chamber groups. The pressurizing chambers 10 related to discharge in the pressurizing chamber groups are disposed in the same manner, namely, disposed at positions obtainable by a parallel shift in the transverse direction. These pressurizing chambers 10 are disposed approximately over the entirety of a region of the upper surface of the flow channel members 4 which is opposed to the piezoelectric actuator substrate 21, though there is a portion having a slightly wider interval, such as that between the pressurizing chamber groups. That is, the pressurizing chamber groups formed by these pressurizing chambers 10 occupy a region having approximately the same shape as the piezoelectric actuator substrate 21. The openings of the pressurizing chambers 10 are closed by the configuration that the piezoelectric actuator substrate 21 is joined to the upper surface of the flow channel member 4.

A flow channel connected to the discharge holes 8, which open into a discharge hole surface 4-1 on a lower surface of the flow channel member 4, extends from a corner part opposed to a corner part to which an individual supply flow channel 14 of the pressurizing chambers 10 is connected. The flow channel extends in a direction away from the pressurizing chambers 10 in a plan view. More specifically, the flow channel extends with a leftward or rightward deviation in a direction along a long diagonal line of the pressurizing chamber 10, while departing in this direction. This makes it possible to dispose the discharge holes 8 at intervals of 1200 dpi as a whole, while disposing the pressurizing chambers 10 in the lattice form in which intervals in each of the pressurizing chamber rows 11 is 37.5 dpi.

In other words, when the discharge holes 8 are projected so as to be orthogonal to a virtual straight line parallel to the longitudinal direction of the flow channel member 4, 16 discharge holes 8 connected to each of the manifolds 5, namely, a total of 32 discharge holes 8 are disposed at equal intervals of 1200 dpi in a range R of a virtual straight line. This makes it possible to form an image at a resolution of 1200 dpi in the longitudinal direction as a whole, by supplying the same color ink to all of the manifolds 5. The 16 discharge hole 8 connected to the single manifold 5 is disposed at equal intervals of 600 dpi in the range R of the virtual straight line. This makes it possible to form a bicolor image at a resolution of 600 dpi in the longitudinal direction as a whole by supplying different colored inks to each of the manifolds 5. On this occasion, by using the two liquid discharge heads 2, it is possible to form a four-color image at a resolution of 600 dpi, enhance printing accuracy, and facilitate setting for printing than using the four liquid discharge heads that is printable at 600 dpi. In this case, because the two manifolds 5 are disposed away from each other, groups made up of the discharge holes 8 that discharge the same color ink are also disposed away from each other. A mixture of inks that can occur due to wiping or the like is therefore less apt to occur. The range R of the virtual straight line is covered with the discharge holes 8 connected from the pressurizing chambers 10 belonging to the single pressurizing chamber column which are arranged side by side in the transverse direction of the head body 2a.

The individual electrodes 25 that are the first electrodes are respectively formed at positions opposed to the pressurizing chambers 10 on the upper surface of the piezoelectric actuator substrate 21. Each of the individual electrodes 25 includes an individual electrode body 25a that is slightly smaller than the pressurizing chamber 10 and has a shape approximately similar to that of the pressurizing chamber 10, and an extracting electrode 25b extracted from the individual electrode body 25a. Similarly to the pressurizing chambers 10, the individual electrodes 25 constitute an individual electrode column and an individual electrode group. The surface electrode 28 for a common electrode that is the second electrode is formed on the upper surface of the piezoelectric actuator substrate 21. The surface electrode 28 for the common electrode is electrically connected, via a through-conductor 34 penetrating through a piezoelectric ceramic layer 21b, to a common electrode 24 that is a third electrode. The surface electrodes 28 for the common electrodes are disposed along the longitudinal direction in a middle part of the piezoelectric actuator substrate 21 in the transverse direction (refer to FIG. 3). The surface electrode 28 for the common electrode includes a connection portion 28a to make a connection to the through-conductor 34, and a small-width portion 28b having a smaller width than the connection portion 28a. The term "width" denotes the shortest diameter length among diameter lengths including the corresponding portion. In FIG. 6(a), a width of the connection portion 28a is W1, and a width of the small-width portion 28b is W2.

The discharge holes 8 are disposed at positions to avoid a region that is opposed to the manifolds 5 disposed on a lower surface side of the flow channel member 4. The discharge holes are further disposed in a region that is opposed to the piezoelectric actuator substrate 21 on the lower surface side of the flow channel member 4. These discharge holes 8 occupy, as a group, a region having approximately the same shape as the piezoelectric actuator substrate 21. Liquid drops are dischargeable from the discharge holes 8 by displacing the displacement elements 30 of the corresponding piezoelectric actuator substrate 21.

The flow channel member 4 included in the head body 2a has a laminate structure having a plurality of plates laminated one upon another. These plates are a cavity plate 4a, a base plate 4b, an aperture plate 4c, a supply plate 4d, manifold plates 4e to 4j, a cover plate 4k, and a nozzle plate 4l in descending order from the upper surface of the flow channel member 4. A large number of holes are formed in these plates. Each of these plates has a thickness of approximately 10-300 μm, thereby enhancing formation accuracy of the holes to be formed. The flow channel member 4 has a thickness of approximately 500 μm to 2 mm. Each of these plates are aligned and laminated so that these holes are communicated to each other and constitute the individual flow channel 12 and the manifold 5. In the head body 2a, components constituting the individual flow channel 12 are disposed close to each other at different positions. Specifically, the pressurizing chamber 10 is disposed on the upper surface of the flow channel member 4, the manifold 5 is disposed on an inside lower surface side, and the discharge hole 8 is disposed on the lower surface, so that the manifold 5 and the discharge hole 8 are connected to each other through the pressurizing chamber 10.

The holes formed in the foregoing plates are described below. These holes can be classified into the following ones. Firstly, there is the pressurizing chamber 10 formed in the cavity plate 4a. Secondly, there is a communication hole constituting the individual supply flow channel 14 connected from one end of the pressurizing chamber 10 to the manifold 5. This communication hole is formed in each of the plates, from the base plate 4b (specifically, an inlet of the pressurizing chamber 10) to the supply plate 4c (specifically, an outlet of the manifold 5). This individual supply flow channel 14 includes the aperture 6 that is a portion formed on the aperture plate 4c and has a small cross-sectional area of the flow channel.

Thirdly, there is a communication hole that constitutes a flow channel being communicated from the other end opposite to the end to which the individual supply flow channel 14 of the pressurizing chamber 10 is connected, to the discharge hole 8. This communication hole is also referred to as a descender (partial flow channel) in the following description. The descender is formed in each of the plates, from the base plate 4b (specifically, an outlet of the pressurizing chamber 10) to the nozzle plate 4l (specifically, the discharge hole 8).

Fourthly, there is a communication hole constituting the sub manifold 5a. This communication hole is formed in the manifold plates 4e to 4j. Holes are formed in the manifold plates 4e to 4j so that partition portions serving as the partition walls 15 remain so as to configure the sub manifold 5b. The partition portions in each of the manifold plates 4e to 4j are brought into a state of being connected to each of the manifold plates 4e to 4j via a half-etched support portion (not shown in the drawing).

The first to forth communication holes are connected to one another to form the individual flow channel 12 that extends from the inlet for a liquid from the manifold 5 (the outlet of the manifold 5) to the discharge hole 8. The liquid supplied to the manifold 5 is discharged from the discharge hole 8 through the following route. Firstly, the liquid goes upward from the manifold 5 and passes through the individual supply flow channel into one end of the aperture 6. The liquid then goes horizontally along an extending direction of the aperture 6 and reaches the other end of the aperture 6. Subsequently, the liquid goes upward from there and reaches one end of the pressurizing chamber 10. Further, the liquid goes horizontally along an extending direction of the pressurizing chamber 10 and reaches the other end of the pressurizing chamber 10. The liquid that has entered the descender from the pressurizing chamber 10 then mainly goes downward while moving in a horizontal direction. Thus, the liquid reaches the discharge hole 8 being opened into the lower surface, and is then discharged to the outside.

The piezoelectric actuator substrate 21 has a laminate structure made up of two piezoelectric ceramic layers 21a and 21b, each being a piezoelectric body. Each of these piezoelectric ceramic layers 21a and 21b has a thickness of approximately 20 µm. A thickness from a lower surface of the piezoelectric ceramic layer 21a to an upper surface of the piezoelectric layer 21b in the piezoelectric actuator substrate is approximately 40 µm. Both the piezoelectric ceramic layers 21a and 21b extend over the pressurizing chambers 10. These piezoelectric ceramic layers 21a and 21b are made of, for example, lead zirconate titanate (PZT) based, $NaNbO_3$ based, $BaTiO_3$ based, $(BiNa)NbO_3$ based, or $BiNaNb_5O_{15}$ based ceramic material. The piezoelectric ceramic layer 21a operates as a vibrating plate, and does not necessarily need to be the piezoelectric body. Alternatively, other ceramic layer and a metal plate, which are not the piezoelectric body, may be used.

The piezoelectric actuator substrate 21 has the common electrode 24 made of an Ag—Pd based metal material or the like, and the individual electrode 25 made of an Au based metal material or the like. As described above, the individual electrode 25 includes the individual electrode body 25a disposed at the position opposed to the pressurizing chamber 10 on the upper surface of the piezoelectric actuator substrate 21, and the extracting electrode 25b extracted from the individual electrode body 25a. The land 26 is also formed, as a part of the extracting electrode 25b, at a portion of one end of the extracting electrode 25b which is extracted beyond a region opposed to the pressurizing chamber 10. The land 26 is made of, for example, Ag—Pd containing glass frit, and is made into a circular shape with a thickness of approximately 15 µm at an end portion of the extracting electrode 25b. A process can be simplified by forming the surface electrode 28 for the common electrode in the same process as the land 26. Although the present embodiment employs this configuration because the individual electrode 25 is made of Au, the individual electrode 25 and the surface electrode 28 for the common electrode may be formed in the same process by using an Ag—Pd conductor as the individual electrode 25. This case eliminates the need to form the land 26.

The individual electrode bump 27 is formed on the land 26. A common electrode bump 32 is formed on the small-width portion 28b that is a part of the surface electrode 28 for the common electrode. Hereinafter, the individual electrode bump 27 and the common electrode bump 32 are also collectively referred to simply as the bump. The bump is a conductive resin containing conductive particles, such as silver particles, and is formed into a convex shape with a height of approximately 50 µm. The bump is electrically connected to an electrode disposed on the wiring board 60. Although the details thereof are described later, a drive signal is to be supplied from the control section 88 to the individual electrode 25 via the wiring board 60. The drive signal is supplied on a fixed cycle in synchronization with a transport velocity of the printing medium P.

The common electrode 24 is formed approximately over the entire surface in a planar direction in a region between the piezoelectric ceramic layer 21a and the piezoelectric ceramic layer 21b. That is, the common electrode 24 extends to cover all the pressurizing chambers 10 in a region opposed to the piezoelectric actuator substrate 21. The common electrode 24 has a thickness of approximately 2 µm. The common electrode 24 is connected through the through-electrode 34 that has entered a via hole formed in and penetrating through the piezoelectric ceramic layer 21b to the connection portion 28a of the surface electrode 28 for the common electrode which is formed at the position to avoid the electrode groups of the individual electrodes 25 on the piezoelectric ceramic layer 21b. The common electrode 24 is grounded and held at ground potential. Similarly to a large number of the individual electrodes 25, the surface electrode 28 for the common electrode is directly or indirectly connected to the control section 88.

A portion of the piezoelectric ceramic layer 21b which is sandwiched between the individual electrode 25 and the common electrode 24 is polarized in a thickness direction, and serves as a displacement element 30 having a unimolf structure which is displaced upon application of a voltage to the individual electrode 25. More specifically, when the individual electrode is set at a different potential from that of the common electrode 24 and an electric field is applied to the piezoelectric ceramic layer 21b in a polarization direction thereof, a portion to which the electric field has been applied acts as an active part that is distorted by piezoelectric effect. With this configuration, the portion of the piezoelectric ceramic layer 21b which is sandwiched between the electrodes (active part) expands and contracts in the planar direction when the control section 88 brings the individual electrode 25 into a predetermined positive or negative potential with respect to the common electrode 24 so that the electric field and the polarization are in the same direction. Meanwhile the piezoelectric ceramic layer 21a that is a non-active layer is not subjected to the influence of the electric field, and therefore does not contract spontaneously but attempts to restrict deformation of the active part. Consequently, a difference of distortion in the planarization direction occurs between the piezoelectric ceramic layer 21a and the piezoelectric ceramic layer 21b. Therefore, the piezoelectric ceramic layer 21a is deformed so as to protrude toward the pressurizing chamber 10 (unimolf deformation).

A liquid discharge operation is described below. The displacement element 30 is driven (displaced) by a drive signal supplied through a driver IC to the individual electrode 25 under the control of the control section 88. Although the liquid is dischargeable by different drive signals in the present embodiment, a so-called pull ejection driving method is described below.

The individual electrode 25 is set to a higher potential than the common electrode 24 (hereinafter referred to as a high potential) in advance. The individual electrode 25 is temporarily set to the same potential as the common electrode 24 (hereinafter referred to as a low potential) every time a discharge request occurs, and is thereafter set again to the high potential at predetermined timing. Thereby, the piezoelectric ceramic layers 21a and 21b (start to) return to their original (flat) shape at the timing that the individual electrode 25 has the low potential, and the volume of the pressurizing chamber 10 is increased compared to an initial state thereof (the state that the potentials of both electrodes are different from each other). Upon this, a negative pressure is applied to the liquid in the pressurizing chamber 10. Subsequently, the liquid in the pressurizing chamber 10 starts to vibrate in an inherent vibration period. Specifically, the volume of the pressurizing chamber 10 firstly starts to increase, and the negative pressure is gradually decreased. Subsequently, the volume of the pressurizing chamber 10 reaches a maximum and the pressure reaches approximately zero. Then, the volume of the pressurizing chamber 10 starts to decrease, and the pressure starts to increase. Thereafter, the individual electrode 25 is set to the high potential at the timing that the pressure reaches an approximately maximum. Upon this, the initially applied vibration and the subsequently applied vibration overlap with each other, and a larger pressure is applied to the liquid. This pressure propagates through the descender and causes the liquid to be discharged from the discharge hole 8.

That is, liquid droplets are dischargeable by supplying the individual electrode 25 with a drive signal of a pulse that keeps the low potential with reference to the high potential for a certain period of time. Provided that this pulse width is an AL (acoustic length) that is half of the time of the inherent vibration period of the liquid in the pressurizing chamber 10, it is in principle possible to maximize the discharge velocity and the amount of discharge of the liquid. The inherent vibration period of the liquid in the pressurizing chamber 10 is considerably influenced by physical properties of the liquid and the shape of the pressurizing chamber 10, and is also influenced by physical properties of the piezoelectric actuator substrate and characteristics of the flow channel connected to the pressurizing chamber 10.

The pulse width is practically set to a value of approximately 0.5-1.5 AL because of other factors to be considered, such as making liquid drops discharged into one. The amount of discharge can be decreased by setting the pulse width to a value beyond the AL. The pulse width is therefore set to the value beyond the AL in order to decrease the amount of discharge.

A large number of the individual electrodes 25 are disposed to achieve high resolution on the piezoelectric actuator substrate 21. Increasing the size of the liquid discharge heads 2 leads to the problem that, for example, it is necessary to enhance alignment accuracy needed for disposing them. Therefore, the individual electrodes 25 are preferably disposed in a possible minimum range, and an area to dispose the surface electrodes 28 for the common electrode is also preferably decreased.

Therefore, the extracting electrode 25b is electrically connected to the outside by forming the land 26 and the bump 27 at a position immediately outside the pressurizing chamber 10 to which the extracting electrode 25b is extracted (namely, the position closer to the pressuring chamber 10 that is the origin of extraction than other pressurizing chamber 10). The present embodiment employs a concept that the extracting electrode 25b includes the land 26. The piezoelectric ceramic layer 21b located between both the land 26 and the individual electrode bump 27 and the common electrode 34 is also subjected to piezoelectric deformation when a voltage is applied to an individual electrode body 25a. The deformation of that portion is undesirable because the deformation deteriorates displacement of the displacement element 30, and crosstalk occurs due to vibration of the deformation transmitted to the pressurizing chamber 10 adjacent thereto. Therefore, the extracting electrode 25b, the land 26, and the individual electrode bump 27 are made fine or small within a range that permits electrical connection or mechanical joining in order to decrease a region subjected to piezoelectric deformation caused by them. Although the common electrode bump 32 is not subject to restriction related to the piezoelectric deformation, the common electrode bump 32 is made in approximately the same size and height as the individual electrode bump 27 because it is often preferable to have the same height as the individual electrode bump 27 when being connected to the wiring board 60.

In consideration of a manufacturing process of the piezoelectric actuator substrate 21, the individual electrode 25, the land 26, and the bump are preferably formed after firing the piezoelectric ceramic layer 21b. When the individual electrode and the surface electrode 28 for the common electrode are formed by firing, it is difficult to have a perfect matching in terms of contraction due to the firing and a contraction curve due to temperature among the individual electrode 25, the surface electrode 28 for the common electrode, and the piezoelectric actuator substrate 21. Therefore, the simultaneous firing may cause a difference in size during a contraction process between a region having the individual electrode 25 and the surface electrode 28 for the common electrode and a region having neither the individual electrode 25 nor the surface electrode 28 for the common electrode, and warping and deformation may occur in the piezoelectric actuator substrate 21 after the firing. The through-conductor 34 is preferably formed by making a via hole by forming a through hole in the piezoelectric ceramic layer 21*b* before the firing, and then introducing a conductor into the via hole. This is because it is easier to form the through hole before the firing, and damage or the like may occur when processed after the firing.

From the foregoing points, the manufacturing process for the piezoelectric actuator substrate 21 preferably includes forming and firing the via hole in the piezoelectric ceramic layer 21*b* before firing, and applying a paste and the like that become the individual electrode 25, the surface electrode 28 for the common electrode, and the land 26, followed by firing. Components and processes having low relevance have been omitted from the above description.

In these processes, misalignment occurs in the via hole by dimension variation due to the firing of the piezoelectric ceramic layer 21*b*. Therefore, the planar shape of the surface electrode 28 for the common electrode which corresponds to a connection portion is enlarged in order to avoid that the surface electrode 28 for the common electrode and the common electrode 24 are not electrically connected to each other due to the misalignment.

To be specific, a size of the surface electrode 28 for the common electrode is preferably 1% or more, more preferably 1.5% or more of a size of the piezoelectric actuator substrate 21. For example, when the size of the piezoelectric actuator substrate 21 is 4 cm×11 cm, the size of the surface electrode for the common electrode is preferably 400 µm×1100 µm or more, more preferably 600 µm×1650 µm or more. In order to enhance reliability of the electrical connection, it is preferable to form so that the surface electrode 28 for the common electrode and the through-conductor 34 are not only overlapped with each other but also the surface electrode 28 for the common electrode covers the through-conductor 34. To achieve this, the size of the surface electrode 28 for the common electrode preferably has a value obtainable by adding a size of the through-conductor 34, for example, 100-300 µm to the above-mentioned size. The longitudinal direction of the surface electrode 28 for the common electrode and the longitudinal direction of the piezoelectric actuator substrate 21 are agreed with each other.

The extracting electrode 25 and the land 26 are made as follows in order to reduce the unnecessary piezoelectric deformation as described above. That is, the extracting electrode 25*b* is made fine, and the land 26 is made small. A size of the extracting electrode 25*b* is preferably 30-300 µm, more preferably 50-200 µm. The land 26 preferably has a circular form with a diameter of 30-300 µm, more preferably 50-200 µm.

Provided that a length of the piezoelectric actuator substrate 21 in the transverse direction is 2 cm or more, and a diameter of the through-conductor is 100 µm, a width of the surface electrode 28 for the common electrode is 300 µm or more, and a diameter of the land 26 is 200 µm or less under the foregoing conditions. Accordingly, there is a difference of more than 1.5 times in terms of width. For the foregoing reasons, there is a tendency that the surface electrode 28 for the common electrode is designed to be larger and the land 26 is designed to be smaller. It follows that an actual difference in width may reach two times or more. It is advantageous to apply one being in liquid form (including a paste form) in terms of costs, though depending on the method of forming the surface electrode 28 for the common electrode and the land 26, and the method of supplying a material that becomes the surface electrode 28 for the common electrode and the land 26. In this way, however, there occurs a difference in cross-sectional shape after the supply due to a difference in planar shape to be formed. That is, a small width results in that a middle part becomes high and has a convex shape, and a large width results in a nearly flat shape. This tendency is enhanced when printing is carried out by screen printing or the like, due to viscosity of a paste to be used for the printing, and behavior of the paste during the printing. Consequently, the land 26 with a protruded middle part has a large height in the middle part thereof, and a cross-sectional shape of the land 26 has a bulge in a middle part thereof. Accordingly, mechanical joining to the individual electrode bump 27 is enhanced, and mechanical joining between the surface electrode 28 for the common electrode and the common electrode bump 32 is weaker than the former.

In contrast, the surface electrode 28 for the common electrode is provided with the large-width connection portion 28*a* to be connected to the through-conductor 34, and the small-width connection portion 28*b* having a smaller width than the connection portion 28*a*, and is connected to the common electrode bump 32 via the small-width portion 28*b*. The small-width portion 28*b* has a cross-sectional shape whose widthwise middle part is protruded, which is similar to the cross-sectional shape of the land 26, thereby enhancing mechanical joining to the common electrode bump 32. A width of the small-width portion 28*b* is preferably approximately equal to the size (width) of the land 26. The term "being approximately equal to" denotes that a large one is preferably 1.4 times or less, more preferably 1.2 times or less of a small one, and particularly preferably both have the same width within a manufacturing variation range.

A thickness of the small-width portion 28*b* is preferably approximately equal to a thickness of an electrode at a portion provided with the bump, which is extracted from the individual electrode body 25*a*. That is, when the land 26 is formed at the extracting electrode 25*b* as in the present embodiment, the thickness of the small-width portion 28*b* is preferably approximately equal to a thickness of the extracting electrode 25*b* including the land 26. When the land 26 is not formed at the extracting electrode 25*b*, the thickness of the small-width portion 28*b* is preferably equal to the thickness of the extracting electrode 25*b* not including the land 26. The term "thickness" denotes a thickness of a portion having the largest thickness in the electrode at the portion provided with the bump. The term "being approximately equal to" denotes that a thick one is preferably 1.2 times or less, more preferably 1.1 times or less of a thin one, and particularly preferably both have the same thickness within a manufacturing variation range. In order to minimize a difference in thickness, the widths of their respective planar shapes are preferably decreased. When disposing the land 26, the thickness of the extracting electrode 25*b* is preferably deceased.

A peripheral edge portion of the small-width portion 28*b* of the surface electrode 28 for the common electrode and a peripheral edge portion of the land 26 are formed in the shape of a slope so as to have a height of zero. Strength can be enhanced by joining the bump to the peripheral edge portions. The term "peripheral edge portion" denotes an area within 50 µm inward from an end. In order to further enhance the mechanical strength, the bump needs to have a shape that extends across the end of the land 26 and the end of the small-width portion 28*b* of the surface electrode 28 for the common electrode. This allows the bump to enter an area which is formed between both of the end portion of the land 26 and an end portion of the small-width portion 28*b* of the surface electrode 28 for the common electrode, and the piezoelectric ceramic layer 21*b*. The area has a cross-sectional shape whose corner parts are narrower than two right angles. It is therefore possible to mechanically enhance the joining strength.

When the bump contains a resin and the common electrode bump 32 and the piezoelectric ceramic layer 21b are joined to each other, joining strength between the resin and the piezoelectric ceramic layer 21b can be enhanced, and therefore the joining of the common electrode bump 32 is enhanced. Further, when the common electrode bump 32 extends across the small-width portion 28b and is joined to the piezoelectric ceramic layer 21b on both sides of the small-width portion 28b, both sides of an end portion that are apt to become an origin from which peeling occurs are joined to the piezoelectric ceramic layer 21b, thereby making it difficult for the common electrode bump 32 to peel off. Conventionally, the common electrode bump 32 is disposed at a large-width portion on the surface electrode 28 for the common electrode. Therefore, the common electrode bump 32 is accommodated inside the surface electrode 28 for the common electrode and not joined to the piezoelectric ceramic layer 21b, resulting in low joining strength.

The land 26 has a circular shape whose cross-sectional shape is configured to protrude further at a central portion thereof. Even in a structure without the land 26, the individual electrode bump 27 is disposed at an end portion of the extracting electrode 25b. Therefore, three directions of four directions face the end portion at the position of the individual electrode bump 27. In contrast, when the common electrode bump 32 is disposed midway along the small-width portion 28b extending in one direction, only two directions of the four directions face the end portion, resulting in a small protrusion at the central portion. Hence, by disposing the common electrode bump 32 at the end portion of the small-width portion 28b extending in the one direction, three directions of the four directions face the end portion, and a cross-sectional shape of a part of the small-width portion 28b of the surface electrode 28 for the common electrode which is connected to the common electrode bump 32 is similar to a cross-sectional shape of the land 26 and a cross-sectional shape of the extracting electrode 25b in the structure without the land 26. It is therefore possible to minimize the difference in joining strength.

The surface electrode 28 for the common electrode is preferably manufactured in the same process as the individual electrode 25 or the land 26. The individual electrode 25 is a portion to be deformed when the displacement element 30 is displaced. Therefore, the individual electrode 25 has a small thickness and a large porosity in order not to suppress deformation. When the individual electrode 25 and the surface electrode 28 for the common electrode are manufactured in the same process, the surface electrode 28 for the common electrode also becomes thin and has a large porosity. The individual electrode 25, the land 26, and the surface electrode 28 for the common electrode are formed by firing. Therefore, even when either one of simultaneous firing and separate firing is employed as the firing together with the piezoelectric ceramic layer 21b, deformation due to the firing may occur. The deformation is less apt to occur by forming the surface electrode 28 for the common electrode so as to have a small thickness and a large porosity.

Hence, the porosity of the surface electrode 28 for the common electrode is preferably 15% or more, more preferably 20% or more, particularly preferably 25% or more. In order to retain strength as a film and avoid generation of a region having local discontinuity with respect to the circumference, the porosity is preferably 55% or less, more preferably 50% or less, and particularly preferably 45% or less.

When the porosity of the surface electrode 28 for the common electrode is 15% or more, the necessity of disposing the small-width portion 28b is further increased as described above. In the absence of the small-width portion 28b, a joining ingredient contained in the bump enters voids and diffuses into the surface electrode 28 for the common electrode. It may follow that the joining ingredient in the bump is decreased and the joining strength is lowered. By disposing the small-width portion 28b and then disposing the bump at that location, it is possible to narrow down a range that permits entry of the joining ingredient in the surface electrode 28 for the common electrode. This minimizes the decrease of the joining ingredient in the bump, thereby minimizing the deterioration of the joining strength.

When the bump contains a thermosetting resin, such as an epoxy resin, and the thermosetting resin is a main ingredient among other ingredients except for conductive particles, the necessity of disposing the small-width portion 28b is particularly increased. The bump before curing contains a monomer. When temperature is increased to carry out the curing, viscosity is lowered, and polymerization is not terminated in such a short period of time. Therefore, the monomer before the polymerization is terminated enters the surface electrode 28 for the common electrode.

The small-width portion 28b is preferably in such a shape as to extend along the longitudinal direction of the piezoelectric actuator substrate 21. The piezoelectric actuator substrate 21 is made long in a resolution direction of printing. Therefore, when the small-width portion 28b is made in such a shape as not to extend along the longitudinal direction of the piezoelectric actuator substrate 21 (for example, in a direction orthogonal thereto), an effective printable area is decreased with respect to the piezoelectric actuator substrate 21 of the same size. That is, it is possible to increase the printable area by making the small-width portion 28b into the shape that extends along the longitudinal direction of the piezoelectric actuator substrate 21. In the head body 2a of the present embodiment, two manifolds 5 are disposed away from each other in order to prevent a mixed color when using different colored inks.

An area of the piezoelectric actuator substrate 21 is effectively usable by making the small-width portion 28b into the shape that extends along the longitudinal direction of the piezoelectric actuator substrate 21, in a region between the manifolds 5 disposed away from each other.

Figure 6B:
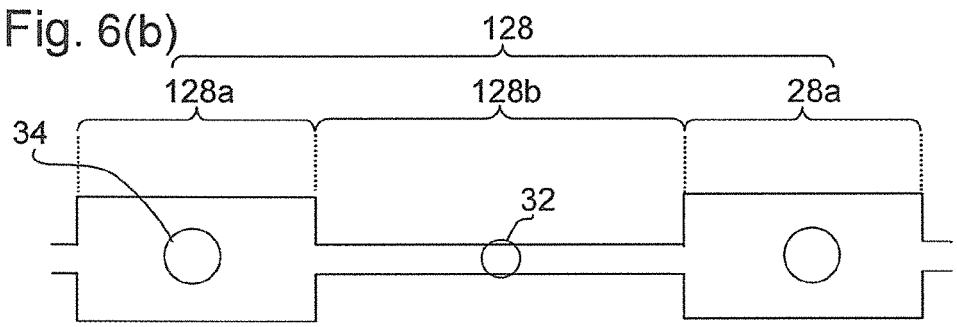

Other form of the surface electrode for the common electrode is described below. FIG. 6(b) shows a surface electrode 128 for a common electrode, which is a second electrode in the present embodiment and usable instead of the surface electrode 28 for the common electrode shown in FIG. 3.

In the surface electrode 128 for the common electrode, a connection portion 128a and a small-width portion 128b are alternately disposed along the longitudinal direction of the piezoelectric actuator substrate 21. By making the surface electrode 128 for the common electrode into this form, an electrical connection to the common electrode 24 and an electrical connection to the outside are made at a plurality of locations. Thus, even when a partial electrical disconnection occurs, a difference in operation for continuity due to the disconnection is reducible.

Figure 6C:
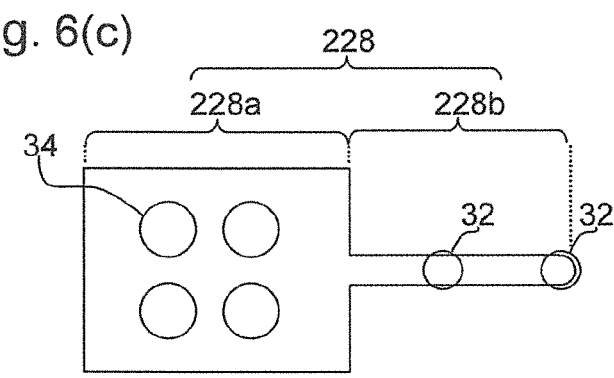

FIG. 6(c) shows a surface electrode 228 for a common electrode, which is a second electrode in other embodiment and usable instead of the surface electrode 28 for the common electrode shown in FIG. 3. In the surface electrode 228 for the common electrode, a plurality of through-conductors 34 are disposed in a connection portion 228a.

Therefore, even when some of the through-conductor 34 are electrically disconnected, it is possible to establish continuity between the surface electrode 228 for the common electrode and the common electrode 24. A plurality of common electrode bumps 32 are disposed at a small-width portion 228b. Therefore, even when some of the common electrode bumps 32 are electrically disconnected, it is possible to establish continuity between the surface electrode 228 for the common electrode and the wiring board 60. Two common electrode bumps 32 are disposed at a small-width portion 228b. Another common electrode bump 32 located on a left side in the drawing is disposed at the small-width portion 228b between the surface electrode 228 for the common electrode and the connection portion 228a which are located on a right side in the drawing. With this configuration, even when a joining ingredient of the common electrode bump 32 located on the right side enters the small-width portion 228b toward the left, because the joining ingredient of the common electrode bump 32 located on the left side has already entered halfway, progress of the entry is suppressed. Consequently, the joining ingredient sufficiently remains in the common electrode bump 32, thereby enhancing the joining strength.

Figure 7A:
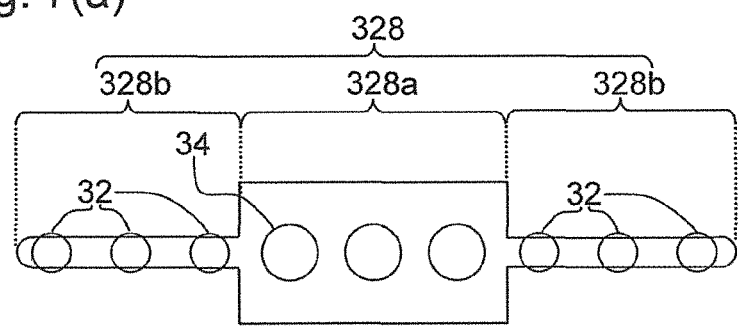
FIGS. 7(a) and 7(b) are plan views of a second electrode in other embodiment of the present invention.

FIG. 7(a) shows a surface electrode 328 for a common electrode, which is a second electrode in other embodiment and usable instead of the surface electrode 28 for the common electrode shown in FIG. 3. In the surface electrode 328 for the common electrode, a plurality of through-conductors 34 are disposed in a connection portion 328a. Therefore, even when some of the through-conductors 34 are electrically disconnected, it is possible to establish continuity between the surface electrode 328 for the common electrode and the common electrode 24. A plurality of common electrode bumps 32 are disposed in a small-width portion 328b. Therefore, even when some of the common electrode bumps 32 are electrically disconnected, it is possible to establish continuity between the surface electrode 328 for the common electrode and the wiring board 60.

Figure 7B:
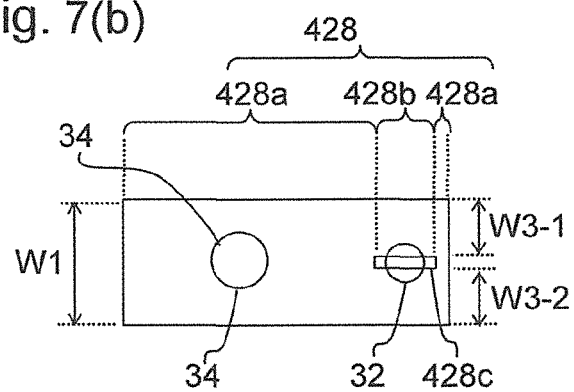

FIG. 7(b) shows a surface electrode 428 for a common electrode, which is a second electrode in other embodiment and usable instead of the surface electrode 28 for the common electrode shown in FIG. 3. A pattern for the surface electrode 428 for the common electrode includes a non-formation part 428c on which no electrode is formed. By the presence of the non-formation part 428c, a width of the small-width portion 428b is a sum of W3-1 and W3-2, and is smaller than a width W1 of a connection portion 428b. Even with this form, it is possible to enhance joining strength owing to the configurations that the piezoelectric ceramic layer 21b and the common electrode bump 32 are joined to each other, and that the common electrode bump 32 is disposed across a peripheral edge of the small-width portion 228b.

FIG. 8 is a plan view of an assembly according to other embodiment of the present invention. A head body 2a is the same as that shown in FIGS. 2 to 5. In the assembly of the present embodiment, a first wiring board 160A and a second wiring board 160B are electrically connected and joined to the piezoelectric actuator substrate 21. The first wiring board 160A extends from a middle part of the piezoelectric actuator substrate 21 in the transverse direction to a long side on a left side, and a front end on the left side is connected to the control section 88 (via other circuit or the like as needed). The second wiring board 160B extends from the middle part of the piezoelectric actuator substrate 21 in the transverse direction to a long side on a right side, and a front end on the right side is connected to the control section 88 (via other circuit or the like as needed).

Two small-width portion rows in which the small-width portions 28b are arranged side by side in the transverse direction of the piezoelectric actuator substrate 21 are disposed in the middle part of the piezoelectric actuator substrate 21 in the transverse direction (refer to FIG. 3). These two small-width portion rows are arranged side by side in the transverse direction of the piezoelectric actuator substrate 21. The small-width portions 28b belonging to a first small-width portion row of these two small-width portion rows, which is disposed close to the long side on the left side of the piezoelectric actuators substrate 21 in FIG. 8, is electrically connected at a position along one side of an outer periphery of the first wiring board 160A. The small-width portions 28b belonging to a second small-width portion row of these two small-width portion rows, which is disposed close to the long side on the right side of the piezoelectric actuators substrate 21 in FIG. 8, is electrically connected at a position along one side of an outer periphery of the second wiring board 160B.

A large number of wiring lines 60c included in the first wiring board 160A are arranged side by side in the longitudinal direction of the piezoelectric actuator substrate 21, and extend along a direction intersecting the longitudinal direction. A large number of wiring lines 60c included in the second wiring board 160B are arranged side by side in the longitudinal direction of the piezoelectric actuator substrate 21, and extend along a direction intersecting the longitudinal direction. The wiring lines in FIG. 8 are schematically shown to make clear an arrangement direction and an extending direction.

A high arrangement density of the wiring lines 60c may increase costs of the wiring board and deteriorate electrical reliability between the wiring lines 60c. In order to decrease the arrangement density of the wiring lines 60c, it is preferable that two wiring boards be used and arranged so as to respectively extend from the two opposing long sides of the piezoelectric actuator substrate 21 as described above. On that occasion, the small-width portions 28b are preferably arranged as described above because the wiring board is less apt to peel off from an end thereof.

Figure 9:
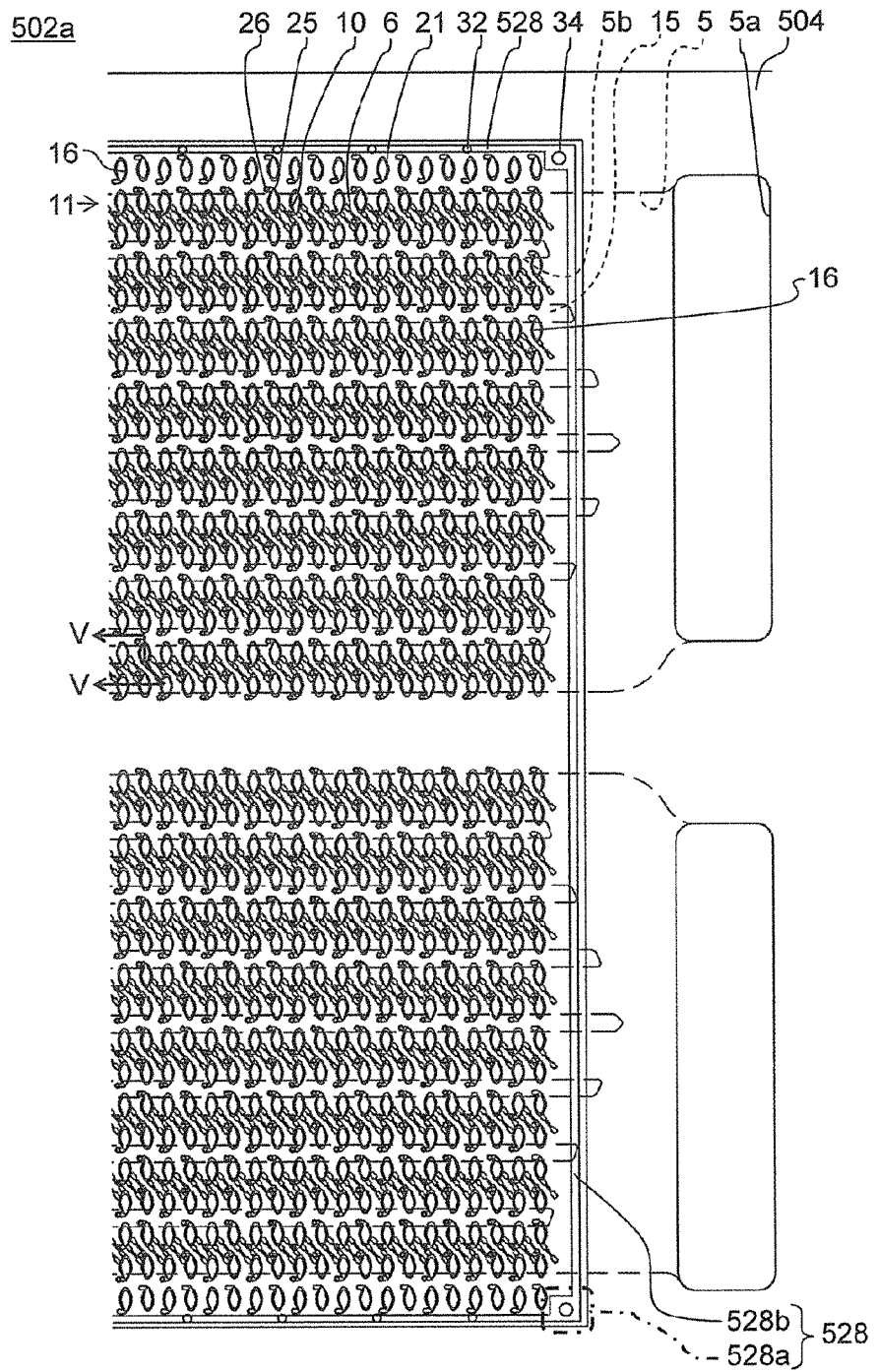
FIG. 9 is a plan view of a head body that is a main component of other liquid discharge head of the present invention.

FIG. 9 is a partial plan view of a head body 502a that is a main component of a liquid discharge head 2 according to other embodiment of the present invention. A basic configuration of the head body 502a is approximately the same as that described with reference to FIGS. 2 to 5. Components having a minor difference are identified by similar reference numerals, and their respective descriptions are omitted.

In the piezoelectric actuator substrate 21 used for the head body 502a, a surface electrode 528 for a common electrode is disposed so as to surround the entirety of a plurality of individual electrodes 25.

When the piezoelectric actuator substrate 21 and the flow channel member 4 are adhesively joined together, an adhesive and a resin for protecting an end surface of the piezoelectric actuator substrate 21 may flow onto the piezoelectric actuator substrate 21. If the adhesive and the like reach the displacement element 30, they may suppress displacement of the displacement element 30. Consequently, discharge characteristics may change, or no discharge may occur. In order to prevent the adhesive from reaching the displacement element 30, the surface electrode 528 for the common electrode needs to be disposed so as to surround the entirety of the individual electrodes 25 as described above. The surface electrode 528 for the common electrode is protruded beyond the surface of the piezoelectric ceramic layer 21b.

Therefore, the surface electrode 528 for the common electrode is capable of decreasing the amount of the adhesive flowing toward the individual electrodes 25 by damming up the adhesive or damming up a part of the adhesive. By arranging the surface electrode 528 for the common electrode along an outer periphery of the piezoelectric actuator substrate 21, the adhesive that flows in from the outside of the piezoelectric actuator substrate 21 can be stopped near an end portion of the piezoelectric actuator substrate 21.

In this case, a connection portion 528a is preferably disposed at four corner parts of the piezoelectric actuator substrate 21. The connection portion 528a has a large area, and hence may deform the surrounding piezoelectric actuator substrate 21. Due to the influence thereof, displacement characteristics of the surrounding displacement element 30 and discharge characteristics of a liquid discharged by the displacement element 30 may vary. However, by being disposed at the corner parts of the piezoelectric actuator substrate 21, a distance from the displacement element 30 is increased, thereby minimizing the influence. This arrangement is particularly effective in the head body 502a in which a row of dummy pressurizing chambers 16 and a column of the dummy pressurizing chambers 16 are disposed at the corner parts of the piezoelectric actuator substrate 21.

The piezoelectric actuator substrate 21 may be brought into an extended shape due to the fact that the corner parts of the piezoelectric actuator substrate 21 are caught by micro projections of a firing tool or the like during firing contraction, and therefore the contraction is facilitated. When a composition that is easy to volatize, such as Pb and Bi, is contained in the piezoelectric ceramic layer 21b, the firing contraction is delayed rather than others by the presence of the through-conductor 34. Therefore, the corner parts are less apt to be caught, thereby reducing deformation of the corner parts.

A large number of wiring lines 60c are arranged on the wiring board 60. Hence, the wiring board 60 is preferably long in one direction. Preferably, the wiring lines 60c extend in the one direction and are disposed so as to be arranged side by side in a direction intersecting the one direction (namely, a width direction). The surface electrode 28 for the common electrode becomes a so-called ground. Therefore, the wring lines 60c to be connected to the ground are preferably thicker than other wiring lines 60c, and are preferably disposed at an end portion of the wiring board 60 in the width direction. An electrical connection between the wiring board 60 and the surface electrode 28 for the common electrode is preferably made on two opposing sides of an outer peripheral portion 28a of the surface electrode 28 for the common electrode which are located at the end portion in the width direction.

Although the foregoing description has been made using the liquid discharge head 2, the piezoelectric substrate is usable as actuators used for the purposes other than the liquid discharge head, such as speakers, buzzers, sensors, and filters that configure electric circuits. When these piezoelectric substrates are adhered to other member with an adhesive, and their circumferences are covered with a resin or the like, they have effects of preventing flowing-in of the adhesive, resin, or the like. Particularly in an assembly having the piezoelectric substrate and a wiring board being electrically connected to each other is useful, for example, for sensors including a large number of sensor elements.

The foregoing liquid discharge head 2 is manufactured in the following manner. That is, with a tape forming method, such as a roll coater method or slit coater method, a tape composed of piezoelectric ceramic raw material powder and an organic composition is formed to produce a plurality of green sheets that are respectively fired into the piezoelectric ceramic layers 21a and 21b. An Ag—Pd paste serving as the common electrode 24 is formed on a surface of each of these green sheets by a printing method or the like. A via hole to be provided with the through-conductor 34 that connects the common electrode 24 and the surface electrode 28 for the common electrode is formed in a part of these green sheets.

Subsequently, these green sheets are laminated one upon another to produce a laminated body, followed by adhesion under pressure. The laminated body after being subjected to the adhesion under pressure is then fired in a high oxygen concentration atmosphere, thereby obtaining a fired body. Thereafter, the individual electrodes 25 are printed and fired on a surface of the fired body by using an organic golden paste. Further, the land 26 and the surface electrode 28 for the common electrode are printed and fired by using an Ag paste. The Ag paste enters the via hole that is opened into the green sheets during the printing, and is connected to the common electrode 24. The entered Ag paste becomes the through-conductor 34. Thus, after the firing, the surface electrode 28 for the common electrode and the common electrode 24 are electrically connected to each other. The piezoelectric actuator substrate 21 is manufactured in the foregoing manner.

Subsequently, the flow channel member 4 is manufactured. That is, holes, which respectively become the manifold 5, the individual supply flow channel 14, the pressurizing chamber 10, and the descender, are processed into their respective predetermined shapes by etching, in the plates 4a to 4l obtained by laminating these plates 4a to 4l obtainable with a rolling method, via an adhesive layer interposed therebetween.

These plates 4a to 4l are preferably formed by at least one kind of metal selected from the group consisting of Fe—Cr based, Fe—Ni based, and WC—Tic based ones. Particularly, when ink is used as a liquid, these plates are preferably made of a material having excellent corrosion resistance to the ink. Therefore, Fe—Cr based one is more preferable. The flow channel member 4 having a plurality of pressurizing element groups is manufactured in the foregoing manner.

The piezoelectric actuator substrate 21 and the flow channel member 4 are laminated and adhered, for example, with an adhesive layer interposed therebetween. Thus, the pressurizing chamber 10 is closed by the piezoelectric actuator substrate 21. As the adhesive layer, a well-known one is usable. However, in order to eliminate the influence on the piezoelectric actuator substrate 21 and the flow channel member 4, it is preferable to use at least one kind of adhesive selected from the group consisting of an epoxy resin, phenol resin, and polyphenylene ether resin, each having a thermal curing temperature of 100-150° C. The piezoelectric actuator substrate 21 and the flow channel member 4 are thermally joined to each other by heating to the thermal curing temperature by using the adhesive layer.

Thereafter, a voltage is applied to between the individual electrode 25 and the common electrode 24, and the piezoelectric ceramic layer 21b that is a portion held therebetween is polarized, thereby obtaining the liquid discharge head 2.

DESCRIPTION OF THE REFERENCE CHARACTER 1 color inkjet printer
2 liquid discharge head
2a, 502a head body
4, 504 flow channel member 4a-4l plates (of flow channel member)
4-1 discharge hole surface
4-2 pressurizing chamber surface
5 manifold
5a opening (of manifold)
5b sub manifold
6 aperture
8 discharge hole
9 discharge hole row
10 pressurizing chamber
11 pressurizing chamber row
12 individual flow channel
14 individual supply flow channel
15 partition wall
16 dummy pressurizing chamber
21 piezoelectric actuator substrate
21a piezoelectric ceramic layer (vibrating plate)
21b piezoelectric ceramic layer
24 common electrode (third electrode)
25 individual electrode (first electrode)
25a individual electrode body
25b extracting electrode
26 land
27 individual electrode bump
28, 128, 228, 328, 428, 528 surface electrode for common electrode (second electrode)
28a, 128a, 228a, 328a, 428a, 528a connection portion
28b, 128b, 228b, 328b, 428b, 528b small-width portion
30 displacement element
32 common electrode bump
34 through-conductor
60, 160A, 160B wiring board
60c wiring line
70 head-mounted frame
72 head group
80a paper feed roller
80b recovery roller
82a guide roller
82b transport roller
88 control section
P printing paper

The invention claimed is:

1. A flat plate-shaped piezoelectric substrate comprising:
a piezoelectric ceramic layer;
a plurality of first electrodes and one or more second electrodes disposed on one main surface of the piezoelectric ceramic layer;
a third electrode disposed on the other main surface of the piezoelectric ceramic layer so as to oppose to the first electrodes; and
a through-conductor penetrating through the piezoelectric ceramic layer and electrically connecting the second electrode and the third electrode,
wherein the second electrode has a first direction and a second direction orthogonal to the first direction, and a length in the first direction is longer than a length in the second direction,
wherein the second electrode comprises a connection portion connected to the through-conductor and a small-width portion having a shorter length in the second direction than a length in the second direction of the connection portion when the piezoelectric substrate is viewed from above, and
wherein one or more bumps for making an electrical connection to an outside are formed on the small-width portion.

2. The piezoelectric substrate according to claim 1, wherein each of the first electrodes comprises a first electrode body and an extracting electrode extracted from the first electrode body, and a width of the extracting electrode is approximately equal to a width of the small-width portion.

3. The piezoelectric substrate according to claim 1, wherein each of the first electrodes comprises a first electrode body and an extracting electrode extracted from the first electrode body, and a thickness of the extracting electrode is approximately equal to a thickness of the small-width portion.

4. The piezoelectric substrate according to claim 1, wherein the one or more bumps are disposed at a peripheral edge of the small-width portion.

5. The piezoelectric substrate according to claim 1, wherein a planar shape of the piezoelectric substrate is long in one direction, and the small-width portion extends from the connection portion along the one direction.

6. The piezoelectric substrate according to claim 5, wherein the second electrode extends along the one direction, and the connection portion and the small-width portion are alternately disposed.

7. The piezoelectric substrate according to claim 1, wherein the planar shape of the piezoelectric substrate a rectangular shape, and the through-conductor and the connection portion are disposed on at least one of four corner parts of the piezoelectric substrate.

8. The piezoelectric substrate according to claim 1,
wherein the one or more bumps contain a resin, and
wherein a part of a bump, of the one or more bumps, joined to the second electrode is joined to the piezoelectric ceramic layer in a plan view.

9. The piezoelectric substrate according to claim 8, wherein a porosity of the second electrode is 15% or more.

10. The piezoelectric substrate according to claim 8, wherein the one or more bumps comprise a conductive particle and another ingredient, and the other ingredient includes mainly an epoxy resin.

11. The piezoelectric substrate according to claim 8, wherein the small-width portion is provided with two or more of the one or more bumps, one of which is disposed on the small-width portion and another of which is disposed between the one bump and the connection portion on the small-width portion.

12. The piezoelectric substrate according to claim 1,
wherein a plurality of bumps for making an electrical connection to an outside are disposed on each of the first electrodes and the second electrode,
wherein the bumps contain a resin, and
wherein the bump joined to the second electrode extends across the small-width portion and is joined to the piezoelectric ceramic layer on both sides of the small-width portion in a plan view.

13. An assembly comprising:
a piezoelectric substrate according to claim 1; and
first and second wiring boards disposed facing the piezoelectric substrate and comprising a plurality of wiring lines electrically connected to the first electrodes and the second electrode,
wherein the piezoelectric substrate is long in one direction, the small-width portion constitutes a plurality of first and second small-width portion rows arranged side by side along the one direction in a middle part of the piezoelectric substrate in a direction orthogonal to the one direction, and the first small-width portion row and the second small-width portion row are arranged in a direction orthogonal to the one direction, wherein the small-width portion belonging to the first small-width portion row and the wiring line of the first wiring board are electrically connected to each other at a position along one side of an outer periphery of the first wiring board, and wherein the small-width portion belonging to the second small-width portion row and the wiring line of the second wiring board are electrically connected to each other at a position along one side of an outer periphery of the second wiring board.

14. A liquid discharge head comprising:
a flow channel member comprising a plurality of discharge holes and a plurality of pressurizing chambers respectively connected to the discharge holes; and
an assembly according to claim 13,
wherein the flow channel member and the piezoelectric substrate are joined to each other.

15. An assembly comprising:
a piezoelectric substrate according to claim 1; and
a wiring board disposed facing the piezoelectric substrate and comprising a plurality of wiring lines electrically connected to the first electrodes and the second electrode, wherein a planar shape of the wiring board is long in one direction and has a pair of sides along the one direction, and wherein the small-width portion extends along each of the pair of sides, and the second electrode and the wiring line are electrically connected to each other at the small-width portion extending along the pair of sides.

16. A liquid discharge head comprising:
a flow channel member comprising a plurality of discharge holes and a plurality of pressurizing chambers respectively connected to the discharge holes; and
a piezoelectric substrate according to claim 1,
wherein the flow channel member and the piezoelectric substrate are joined to each other.

17. A recording device comprising:
a liquid discharge head according to claim 16;
a transport section to transport a recording medium to the liquid discharge head; and
a control section to control the liquid discharge head.

* * * * *